(12) United States Patent
Yen et al.

(10) Patent No.: US 8,628,636 B2
(45) Date of Patent: Jan. 14, 2014

(54) METHOD OF MANUFACTURING A PACKAGE SUBSTRATE

(75) Inventors: Lee-Sheng Yen, Toayuan (TW); Doau-Tzu Wang, Toayuan (TW)

(73) Assignee: Advance Materials Corporation, Toayuan (TW)

( * ) Notice: Subject to any disclaimer, the term of this patent is extended or adjusted under 35 U.S.C. 154(b) by 64 days.

(21) Appl. No.: 13/350,008

(22) Filed: Jan. 13, 2012

(65) Prior Publication Data

US 2013/0180651 A1    Jul. 18, 2013

(51) Int. Cl.

| B29C 65/52 | (2006.01) |
|---|---|
| B32B 37/12 | (2006.01) |
| B32B 37/14 | (2006.01) |
| B32B 37/26 | (2006.01) |
| B32B 38/10 | (2006.01) |
| B32B 7/06 | (2006.01) |

(52) U.S. Cl.
USPC ........... 156/247; 156/263; 156/278; 156/291; 156/307.1; 156/704; 156/719

(58) Field of Classification Search
USPC ......... 156/247, 249, 250, 263, 278, 280, 291, 156/307.1, 307.4, 370.5, 701, 703, 704, 719
See application file for complete search history.

(56) References Cited

U.S. PATENT DOCUMENTS

| 7,893,540 B2 * | 2/2011 | Ishino et al. ................... 257/777 |
|---|---|---|
| 7,939,935 B2 * | 5/2011 | Chinda et al. ................. 257/700 |
| 8,042,445 B2 * | 10/2011 | Lin et al. .......................... 83/879 |
| 8,062,539 B2 * | 11/2011 | Nakamura ....................... 216/83 |
| 8,196,293 B2 * | 6/2012 | Ko .................................... 29/830 |
| 8,298,940 B2 * | 10/2012 | Ishino et al. .................... 438/667 |
| 2002/0150838 A1 * | 10/2002 | Zhang et al. ................... 430/311 |
| 2002/0155661 A1 * | 10/2002 | Massingill et al. ........... 438/244 |
| 2003/0058078 A1 * | 3/2003 | Busletta et al. ............... 336/223 |
| 2003/0173331 A1 * | 9/2003 | Tsai et al. ........................ 216/13 |
| 2006/0272853 A1 * | 12/2006 | Muramatsu et al. .......... 174/262 |
| 2007/0018287 A1 * | 1/2007 | Coenen .......................... 257/666 |
| 2007/0268675 A1 * | 11/2007 | Chinda et al. ................. 361/748 |
| 2008/0136041 A1 * | 6/2008 | Kotake et al. ................. 257/774 |
| 2008/0169568 A1 * | 7/2008 | Kotake et al. ................. 257/773 |
| 2008/0196931 A1 * | 8/2008 | Lee et al. ....................... 174/260 |
| 2008/0248596 A1 * | 10/2008 | Das et al. .......................... 438/3 |
| 2008/0257480 A1 * | 10/2008 | Nakamura .................... 156/150 |
| 2009/0232925 A1 * | 9/2009 | Lin et al. ........................ 425/306 |
| 2009/0294990 A1 * | 12/2009 | Ishino et al. .................. 257/777 |
| 2009/0316373 A1 * | 12/2009 | Kim et al. ...................... 361/764 |
| 2010/0007456 A1 * | 1/2010 | Joehren et al. ................ 336/200 |
| 2010/0109052 A1 * | 5/2010 | Nakajima et al. ............. 257/197 |
| 2010/0139090 A1 * | 6/2010 | Muramatsu et al. ........... 29/846 |
| 2011/0007998 A1 * | 1/2011 | Yamamoto et al. ............. 385/14 |
| 2011/0013865 A1 * | 1/2011 | Shibata et al. .................. 385/14 |
| 2011/0018669 A1 * | 1/2011 | Ikriannikov ................... 336/192 |
| 2011/0057324 A1 * | 3/2011 | Kotake et al. ................. 257/774 |
| 2011/0088937 A1 * | 4/2011 | Ko ................................. 174/261 |
| 2011/0088938 A1 * | 4/2011 | Ko ................................. 174/263 |
| 2011/0104852 A1 * | 5/2011 | Ishino et al. .................. 438/107 |
| 2011/0127073 A1 * | 6/2011 | Ryu et al. ...................... 174/257 |

(Continued)

*Primary Examiner* — Sing P Chan
(74) *Attorney, Agent, or Firm* — Edwards Wildman Palmer LLP; Peter F. Corless; Steven M. Jensen

(57) ABSTRACT

A method of manufacturing a package substrate. A carrier member is formed on an insulation protection layer on either of two surfaces of a core layer. The package substrate has the carrier member combined with one side thereof, and is prevented from being damaged during transportation or packaging due to reduced thickness.

10 Claims, 5 Drawing Sheets

(56) References Cited

U.S. PATENT DOCUMENTS

| | | |
|---|---|---|
| 2011/0141711 A1* | 6/2011 | Sohn et al. .................... 361/760 |
| 2012/0087097 A1* | 4/2012 | Hong et al. ................... 361/763 |
| 2012/0189818 A1* | 7/2012 | Hayashi ........................ 428/161 |
| 2012/0228007 A1* | 9/2012 | Ko ................................ 174/251 |
| 2012/0228015 A1* | 9/2012 | Ho ................................ 174/260 |
| 2013/0011967 A1* | 1/2013 | Ishino et al. .................. 438/107 |

* cited by examiner

METHOD OF MANUFACTURING A PACKAGE SUBSTRATE

BACKGROUND OF THE INVENTION

1. Field of the Invention

This invention relates to methods of manufacturing a package substrate, and particularly, to a method of manufacturing a package substrate for use in a miniaturized product.

2. Description of Related Art

With the blooming of the electronic industry, an electronic product generally develops with a compact size, multiple functions and high performance. To meet the miniaturization requirement, a package substrate that is used to carry a chip preferably has a reduced thickness. Currently, the package substrate is made of a hard material or a soft material. For instance, a package substrate used in a ball grid array (BGA) package is made of a hard material.

Referring to FIGS. 1A to 1C, cross-sectional views illustrating a method of manufacturing a package substrate 1 having two circuit layers according to the prior art are provided.

As shown in FIG. 1A, two core layers 10 are provided, each of the core layers 10 has a first surface 10a and a second surface 10b opposing the first surface 10a, a first metal layer 11a and a second metal layer 11b are formed on the first surface 10a and the second surface 10b, respectively, and a plurality of through holes 100 connect the first and second surface 10a and 10b.

As shown in FIG. 1B, a patterning process is performed. Through the first and second metal layers 11a and 11b (using a conductive layer 12 to electroplate metal), first and second circuit layers 13a and 13b are formed on the first and second surfaces 10a and 10b, respectively. Additionally, a conductive via 14 is formed in each of the through hole 100 to electrically connect the first and second circuit layers 13a and 13b. The first and second circuit layers 13a and 13b have a plurality of first and second conductive pads 130a and 130b, respectively.

As shown in FIG. 1C, first and second insulating protection layers 15a and 15b are formed on the first and second surfaces 10a and 10b of the core layer 10, respectively. The first and second insulating protection layers 15a and 15b have a plurality of first and second openings 150a and 150b, respectively, allowing the first and second conductive pads 130a and 130b to be exposed from the first and second opening 150a and 150b, respectively. Sequentially, first and second surface treatment layers 16a and 16b are formed on the exposed surfaces of the first and second conductive pads 130a and 130b, respectively.

In subsequent processes, a chip is mounted on the second insulating protection layer 15b, and a molding process is then performed to obtain a package structure. In order to meet the miniaturization and reliability requirements, the core layer 10 has a thickness S reduced to as small as 60 μm.

However, the core layer 10 having the thickness of 60 μm no longer meets the modern miniaturization requirement. If the thickness S of the core layer 10 is less than 60 μm, the package substrate 1 has a thickness S less than 150 μm. Such a thin package substrate is easily to be damaged during transportation or packaging.

Therefore, how to solve the problem that the miniaturization is contradictory to the reliability is becoming one of the most popular issues in the art.

SUMMARY OF THE INVENTION

In view of the above-mentioned problems of the prior art, the present invention provides a method of manufacturing a package substrate, comprising: providing two core layers, each having a first surface and a second surface opposing the first surface; connecting the two core layers in a manner that the second surfaces of the two core layers are connected by a connection member; forming a first circuit layer on the first surface of each of the core layers; forming a first insulating protection layer on the first circuit layer and the first surface of each of the core layers, with a portion of the first circuit layer exposed from the first insulating protection layer; combining a carrier member with each of the first insulating protection layers by an adhesive layer; removing the connection member to form two substrate bodies, each of which being constituted by the core layer, the first circuit layer, the first insulating protection layer and the carrier member; connecting the carrier members of the two substrate bodies by a combining member, such that the combining member combines the two substrate bodies and the second surface of each of the core layers is exposed; forming a plurality of through holes penetrating each of the core layers from the second surface thereof, with the first circuit layers exposed from the through holes; forming a second circuit layer on the second surface of each of the core layers, and forming in each of the through hole a conductive via for electrically connecting the first and second circuit layers; forming a second insulating protection layer on the second circuit layer and the second surface of each of the core layer, with a portion of the second circuit layer exposed from the second insulating protection layer; and removing the combining member to form two package substrates, each of which being constituted by the core layers, the first and second circuit layer, the first and second insulating protection layers and the carrier member.

In an embodiment, the carrier members of the two substrate bodies are stacked by a combining member, prior to the formation of the second circuit layers.

In an embodiment, the adhesive layer is made of a super glue or a release agent, and the carrier member is made of a high-temperature material.

In an embodiment, on the first and second surfaces of each of the core layers metal layers are formed for being patterned to form the first and second circuit layers, respectively.

In an embodiment, a surface treatment layer is further formed on the exposed portions of the first and second circuit layers.

Therefore, in the method of manufacturing a package substrate according to the present invention, a carrier member is combined with a first insulating protection layer of the package substrate, to prevent the package substrate from being damaged during transportation and packaging due to reduced thickness. After the molding process is completed, the carrier member is removed. As a result, the package substrate has a thickness less than 150 μm, and has a reduced overall thickness, as compared to the prior art. Therefore, the package substrate manufactured by the method according to the present invention meets the miniaturization and reliability requirements.

BRIEF DESCRIPTION OF DRAWINGS

The invention can be more fully understood by reading the following detailed description of the preferred embodiments, with reference made to the accompanying drawings, wherein:

FIG. 2F' is another embodiment of FIG. 2F.

DETAILED DESCRIPTION OF THE INVENTION

The following illustrative embodiments are provided to illustrate the disclosure of the present invention, in which these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Referring to FIGS. 2A to 2I, cross-sectional views illustrating a method of manufacturing a package substrate 2 according to the present invention are provided.

Figure 1A:
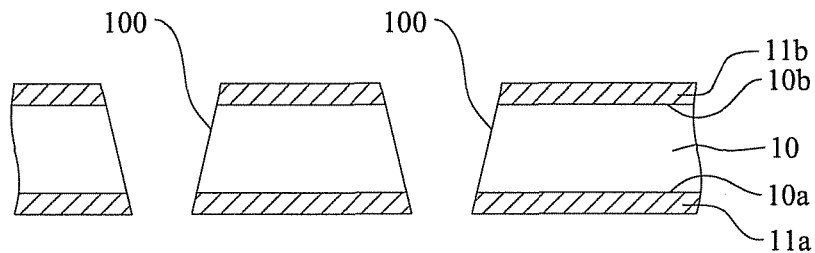
FIGS. 1A to 1C are cross-sectional views illustrating a method of manufacturing a package substrate having two circuit layers according to the prior art.
Figure 1B:
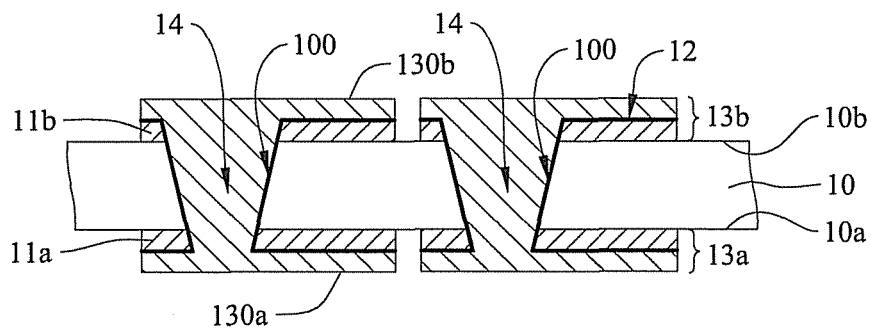
Figure 1C:
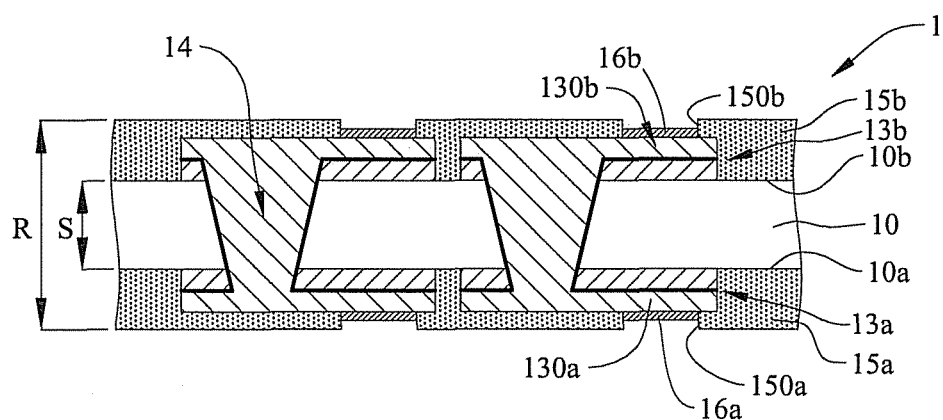
Figure 2A:
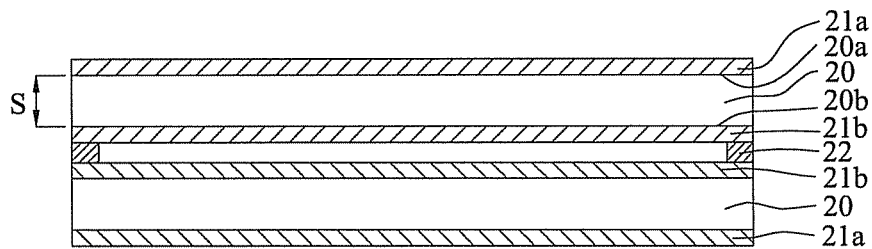
FIGS. 2A to 2J are cross-sectional views illustrating a method of manufacturing a package substrate according to the present invention.

As shown in FIG. 2A, two core layers 20 are provided. Each of the core layers 20 has a first surface 20a and a second surface 20b opposing the first surface 20a. A first metal layer 21a and a second metal layer 21b are formed on the first surface 20a and the second surface 20b, respectively. Then, a plurality of connection members 22 are combined with the second metal layer 21b on the second surface of each of the core layers 20, so as to stack two core layers 20 by the connection members 22.

In an embodiment, the core layers 20 are made of an organic polymer material such as Bismaleimide-Triazine (BT), or a dielectric material such as a prepreg, and have a thickness less than 60 μm (e.g., 30 μm). The first and second metal layers 21a and 21b are made of copper, and the connection member 22 may be a gel bump (as shown in FIG. 2A) or a gel layer.

Although the core layers 20 have a thickness S less than 60 μm, the overall thickness of the package substrate 2 is increased through the stacking of two core layers 20. Therefore, the package substrate 2 can be manufactured by equipment that is used in an original process to manufacture a package substrate, and the manufacturing cost is reduced.

Figure 2B:
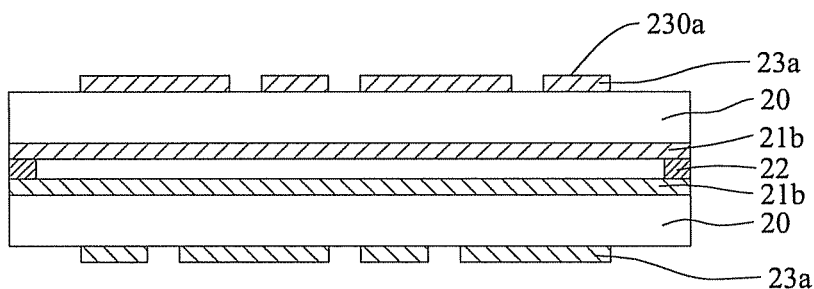

As shown in FIG. 2B, a patterning process is preformed, and a first circuit layer 23a is formed, through the first metal layer 21a, on the first surface 20a of the core layer 20. The first circuit layer 23a has a plurality of first conductive pads 230a.

There are a variety of circuit formation processes, which are not the features of the present invention, and further description thereof is hereby omitted.

Figure 2C:
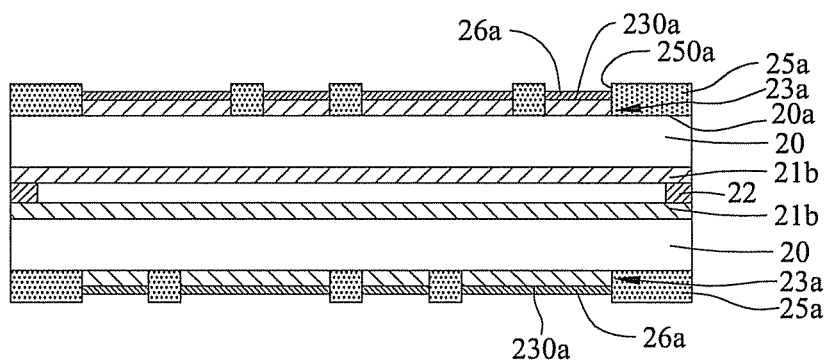

As shown in FIG. 2C, a first insulating protection layer 25a is formed on the first circuit layer 23a and the first surface 20a of each of the core layers 20. The first insulating protection layer 25a has a plurality of first openings 250a, allowing the first conductive pads 230a to be exposed therefrom. In other embodiments, by lowering the surface height of the first insulating protection layer 25a, the first conductive pad 230a is higher than or flushes with the first insulating protection layer 25a, so as to expose the first conductive pads 230a. Then, a first surface treatment layer 26a is formed on the first conductive pad 230a in each of the first openings 250a.

Figure 2D:
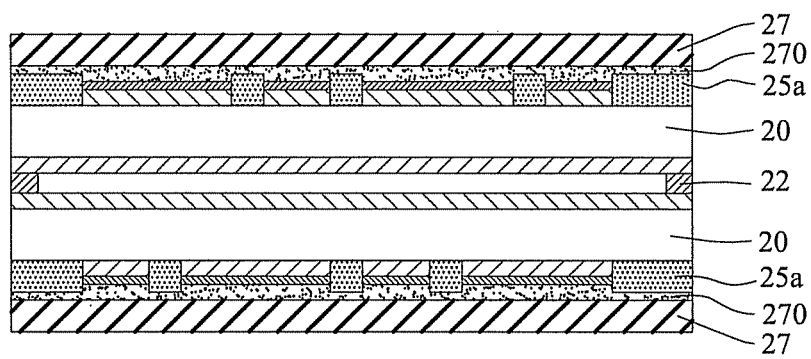

As shown in FIG. 2D, the first insulating protection layer 25a is combined by an adhesive layer 270 with a carrier member 27, to cover the first surface treatment layer 26a on the first conductive pads 230a. In an embodiment, the adhesive layer 270 is made of a super glue or a release agent, and the carrier member 27 is made of a high-temperature material such as a copper clad laminate (CCL).

Figure 2E:
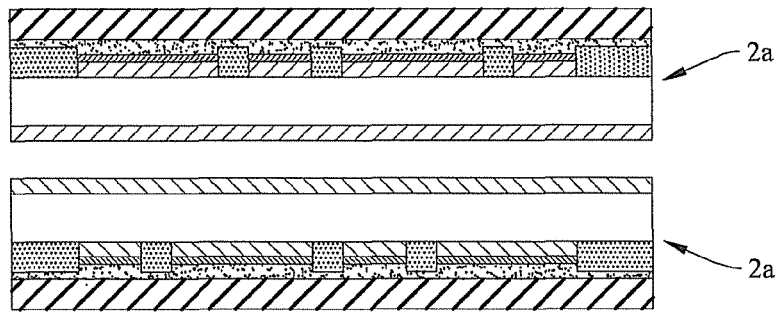

As shown in FIG. 2E, the connection members 22 are removed to separate and form two substrate bodies 2a, such that each of the substrate bodies 2a is constituted by the core layer 20, the first circuit layer 23a, the first insulating protection layer 25a and the carrier member 27.

Figure 2F:
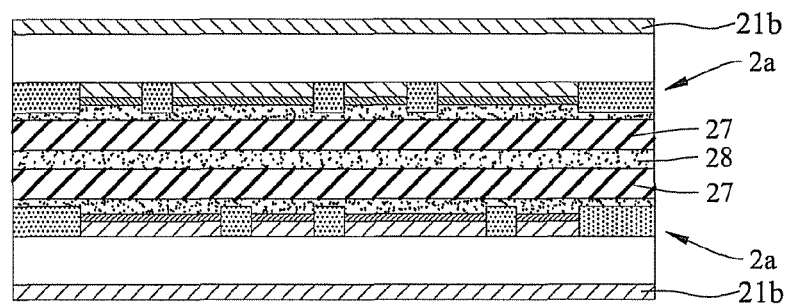
Figure 2F:
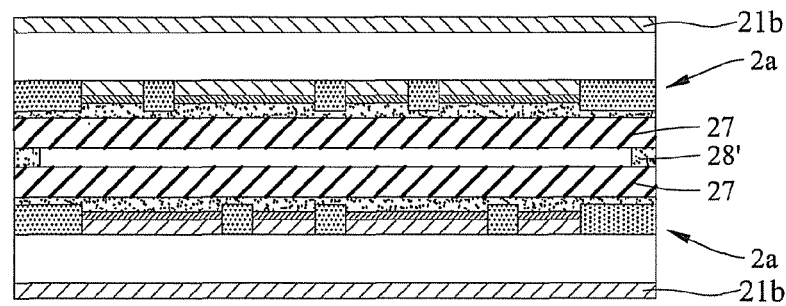

As shown in FIG. 2F or FIG. 2F', combining members 28, 28' are employed to combine the carrier members 27 of the two substrate bodies 2a, with the second metal layer 21b being exposed. In an embodiment, the combining members 28, 28' are adhesive bumps (as shown in FIG. 2F') or gel layers (as shown in FIG. 2F).

Figure 2G:
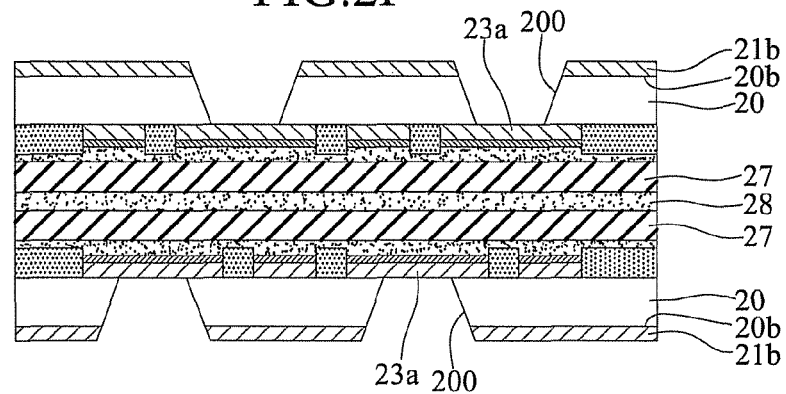

As shown in FIG. 2G, subsequent to the process of FIG. 2F, a plurality of though holes 200 penetrating the core layers 20 from the second surfaces 20b thereof are formed on each of the second metal layers 21b, allowing the first circuit layers 23a to be exposed therefrom.

Figure 2H:
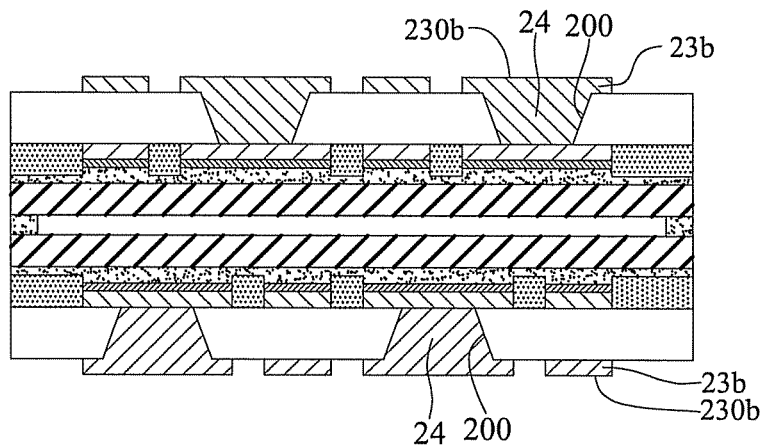

As shown in FIG. 2H, each of the second metal layers 21b is formed to be a second circuit layer 23b, and a conductive via 24 is formed in each of the through holes 200 to electrically connect the first and second circuit layers 23a and 23b, and each of the second circuit layers 23b has a plurality of second conductive pads 230b.

Figure 2I:
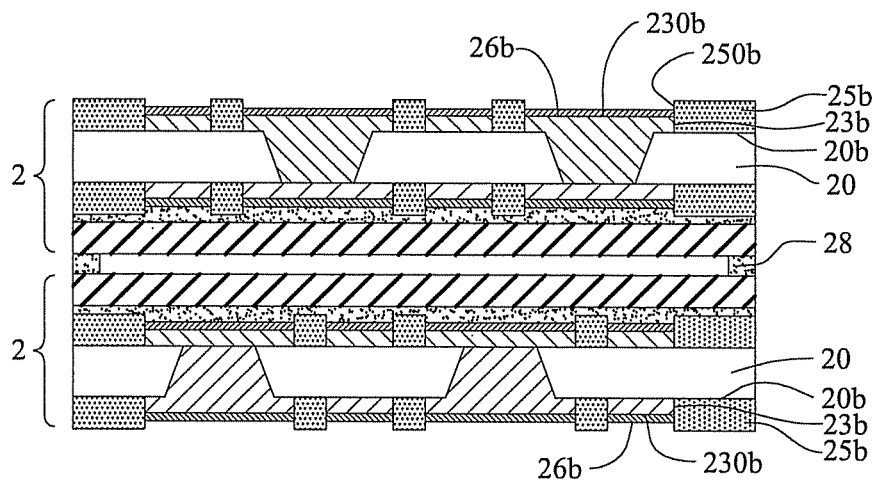

As shown in FIG. 2I, a second insulating protection layer 25b is formed on the second circuit layer 23b and the second surface 20b of each of the core layers 20, and has a plurality of second openings 250b, allowing the second conductive pads 230b to be exposed therefrom correspondingly, so as to form two stacked package substrates 2, each of which being constituted by the core layer 20, the first and second circuit layers 23a and 23b, the first and second insulating protection layers 25a and 25b and the carrier member 27.

Next, a second surface treatment layer 26b is formed on the exposed second conductive pads 230b.

In other embodiments, by lowering the surface height of the second insulating protection layer 25b, the second conductive pad 230b is higher than or flushes with the second insulating protection layer 25b, so as to expose the second conductive pads 230b.

Figure 2J:
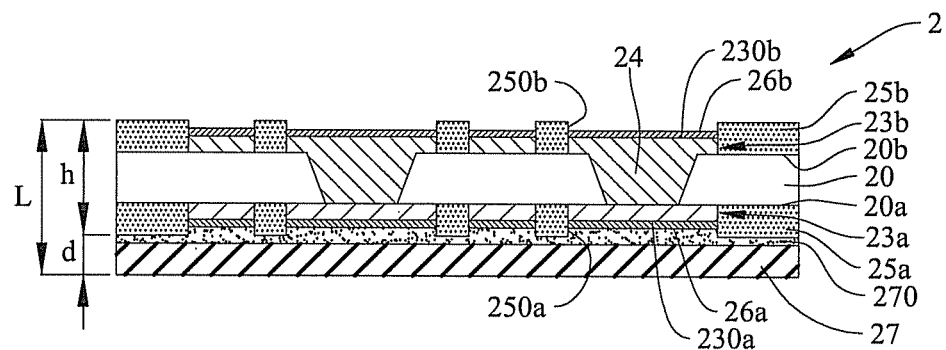

As shown in FIG. 2J, the combining member 28 is removed to form two individual package substrates 2, which has a remaining thickness h that is obtained by deducting a thickness d of the carrier member 27 (the adhesive layer 27 has a thickness that is very thin and can be ignored) from the thickness L of the package substrate 2 and is less than 150 μm. The thickness d of the carrier member 27 may be changed on demands.

Figure 3A:
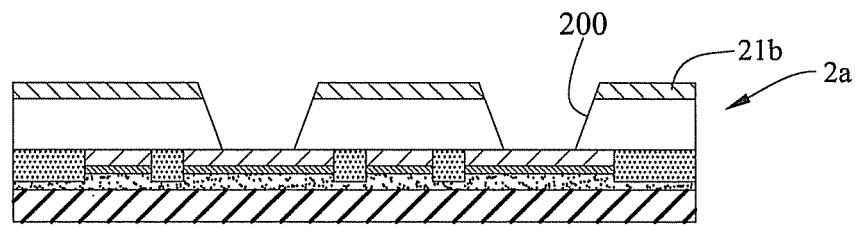
FIGS. 3A to 3C are cross-sectional views illustrating a method of manufacturing a package substrate of another embodiment according to the present invention.
Figure 3B:
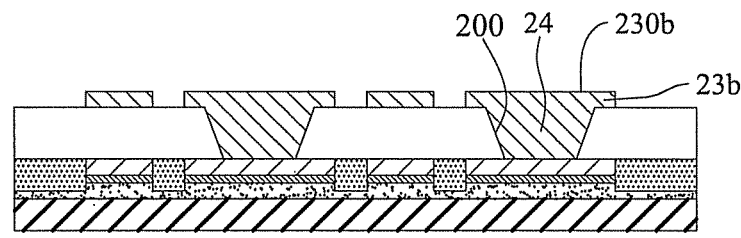
Figure 3C:
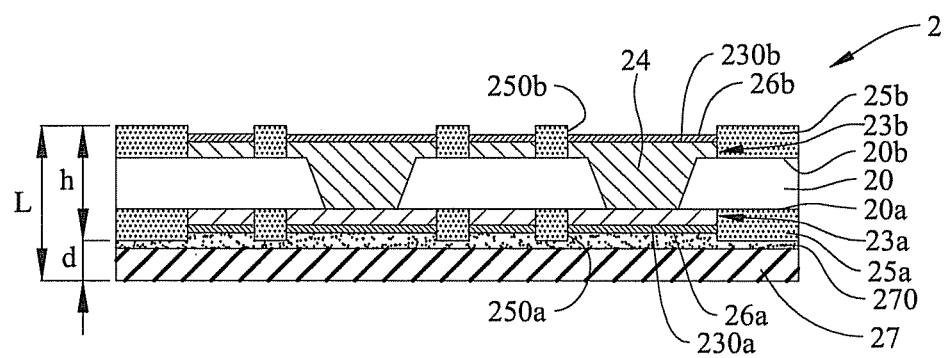

Referring to FIGS. 3A to 3C, cross-sectional views illustrating a method of manufacturing a package substrate 2 of another embodiment according to the present invention are provided.

As shown in FIG. 3A, which shows the process of FIG. 2E, the connection member 22 is removed to form two substrate bodies 2a, each of which being constituted by the core layer 20, the first circuit layer 23a, the first insulating protection layer 25a and the carrier member 27.

As shown in FIG. 3B, the substrate bodies 2a are not stacked and the through holes 200 are directly formed in the second metal layers 21b. And, the second metal layer 21b is patterned to form the second circuit layer 23b that has a plurality of second conductive pads 230b, and a conductive via 24 is formed in each of the trough holes 200 for electrically connecting the print circuit layer 23a and the second circuit layer 23b.

As shown in FIG. 3C, second insulating protection layers 25b are formed on the second circuit layer 23b and the second surface 20b of each of the core layers 20, and the second insulating protection layer 25b has a plurality of second openings 250b, allowing the second conductive pads 230b to be exposed therefrom. Accordingly, the package substrates 2 is formed.

Then, the second surface treatment layer 26b is formed on the exposed surfaces of the second conductive pads 230b, and the remaining thickness h of the package substrate 2 that is equal to the thickness L deducted by the thickness d of the carrier member 27 (the adhesive layer 270 is very thin and can be ignored) is less than 150 µm.

When a substrate structure having a thickness less than 150 µm is manufactured, the process and equipment are rearranged, and the manufacturing cost is increased. According to the present invention, although the remaining thickness h of the package substrate 2 is less than 150 µm, the overall thickness L of the package substrate 2, when the carrier member 27 is of thickness d, is still greater than or equal to 150 µm. Therefore, the package substrate 2 can be manufactured by the original equipment, and the manufacturing cost is not increased.

In the subsequent processes of fabricating the package substrate 2 according to the present invention, after a chip (not shown) is mounted on the second insulating protection layer 25b, a molding process is performed and the carrier member 27 is removed to form a package structure. Therefore, through the deduction of the thickness d of the carrier member 27 from the thickness L of the package substrate 2, the remaining thickness h is still less than 150 µm, and the overall thickness of the package structure is thus reduced. Compared to the prior art, the present invention can provide a package substrate 2 that has a thickness less than 150 µm after the carrier member 27 is removed, so as to meet the miniaturization requirement.

Since still having the carrier member 27 after and before the packaging process, the package substrate 2 has an improved strength, and is not easily damaged during transportation and packaging, as compared with the prior art.

Through the stacking manner (e.g., stacking two core layers 20 or stacking two substrate bodies 2a), two lots of products can be manufactured at the same time, and the yield is increased.

In sum, in the method of manufacturing a package substrate according to the present invention a carrier member is combined with the first insulating protection layer of the package substrate. The package substrate thus has an improved strength, and is not easily to be damaged during transportation or packaging.

Moreover, since the carrier member is removed after the packaging process is completed, the thus-obtained package substrate has a thickness less than 150 µm. Therefore, the overall thickness of the package structure is reduced, and the miniaturization and reliability requirements are met.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method of manufacturing a package substrate, comprising:

providing two core layers, each of which having a first surface and a second surface opposing the first surface;

connecting the two core layers in a manner that the second surfaces of the two core layers are connected by a connection member;

forming a first circuit layer on the first surface of each of the core layers;

forming a first insulating protection layer on the first surface and the first circuit layer of each of the core layers, with a portion of the first circuit layer exposed from the first insulating protection layer;

combining a carrier member with each of the first insulating protection layers by an adhesive layer;

removing the connection member to form two substrate bodies, each of which being constituted by the core layer, the first circuit layer, the first insulating protection layer and the carrier member;

connecting the carrier members of the two substrate bodies by a combining member, such that the combining member combines the two substrate bodies and the second surface of each of the core layers is exposed;

forming a plurality of through holes penetrating each of the core layers from the second surface thereof, with the first circuit layers exposed from the through holes;

forming a second circuit layer on the second surface of each of the core layers, and forming in each of the through holes a conductive via electrically connecting the first and second circuit layers;

forming a second insulating protection layer on the second circuit layer and the second surface of each of the core layer, with a portion of the second circuit layer exposed from the second insulating protection layer; and removing the combining member to form two package substrates, each of which being constituted by the core layer, the first and second circuit layers, the first and second insulating protection layers, and the carrier member.

2. The method of claim 1, wherein the combining member is an adhesive bump or a gel layer.

3. The method of claim 1, wherein the adhesive layer is made of a super glue or a release agent.

4. The method of claim 1, wherein the carrier member is made of a heat-resistant material.

5. The method of claim 1, wherein each of the core layers has a first metal layer and a second metal layer on the first surface and the second surface thereof, respectively, so as to form, by the first and second metal layers, first and second circuit layers that have first and second conductive pads, respectively.

6. A method of manufacturing a package substrate, comprising:

providing two core layers, each of which having a first surface and a second surface opposing the first surface;

connecting the two core layers in a manner that the second surfaces of the two core layers are connected by a connection member;

forming a first circuit layer on the first surface of each of the core layers;

forming a first insulating protection layer on the first circuit layer and the first surface of each of the core layers, with a portion of the first circuit layer exposed from the first insulating protection layer;

combining each of the first insulating protection layers with a carrier member by an adhesive layer;

removing the connection member, to form two substrate bodies, each of which being constituted by the core layer, the first circuit layer, the first insulating protection layer and the carrier member;

forming a plurality of through holes penetrating the core layers from the second surfaces thereof, with the first circuit layers exposed from the through holes;

forming a second circuit layer on the second surface of the core layer, and forming in each of the through holes a conductive via for electrically connecting the first and second circuit layers; and forming a second insulating protection layer on the second circuit layer and the second surface of the core layer, with a portion of the second circuit layer exposed from the second insulating protection layer, so as to form two package substrates that each is constituted by the core layer, the first and second circuit layer, the first and second insulating protection layer and the carrier member.

7. The method of claim 6, wherein the adhesive layer is made of a super glue or a release agent.

8. The method of claim 6, wherein the carrier member is made of a heat-resistant material.

9. The method of claim 6, wherein the first and second surfaces of each of the core layers have a first metal layer and a second metal layer formed thereon, respectively, so as to form, by the first and second metal layers, first and second circuit layers that have first and second conductive pads, respectively.

10. The method of claim 6, further comprising forming a surface treatment layer on the portion of the first circuit layer and the portion of the second circuit layer that are exposed from the first and second insulating protection layers.

* * * * *